United States Patent [19]
Morton

[11] Patent Number: 5,202,855
[45] Date of Patent: Apr. 13, 1993

[54] DRAM WITH A CONTROLLED BOOSTED VOLTAGE LEVEL SHIFTING DRIVER

[75] Inventor: Bruce L. Morton, Round Rock, Tex.

[73] Assignee: Motorola, Inc., Schaumburg, Ill.

[21] Appl. No.: 640,776

[22] Filed: Jan. 14, 1991

[51] Int. Cl.⁵ .............................................. G11C 7/00
[52] U.S. Cl. ................................ 365/226; 365/189.11; 365/230.06
[58] Field of Search ............... 365/226, 189.11, 230.06

[56] References Cited

U.S. PATENT DOCUMENTS

| | | | |
|---|---|---|---|
| 3,976,984 | 8/1976 | Hirasawa | 365/189.11 |
| 4,618,785 | 10/1986 | van Tran | 365/190 |
| 4,787,066 | 11/1988 | Leuschner | 365/189.11 |
| 4,860,257 | 8/1989 | Choi | 365/189.11 |
| 5,031,149 | 7/1991 | Matsumoto et al. | 365/189.11 |

FOREIGN PATENT DOCUMENTS

| | | | |
|---|---|---|---|
| 0250894 | 10/1986 | Japan | 365/230.06 |
| 0220497 | 9/1988 | Japan | 365/230.06 |
| 0185797 | 7/1990 | Japan | 365/230.06 |

OTHER PUBLICATIONS

1990 Symposium on VLSI Circuits, "A 1.5V Circuit Technology for 64MB DRAMs" by Nakagome et al., 1990, pp. 17-18.

*Primary Examiner*—Eugene R. LaRoche
*Assistant Examiner*—Tan Nguyen
*Attorney, Agent, or Firm*—Robert L. King

[57] ABSTRACT

A DRAM contains both driver control logic and level shifting driver circuitry to generate a voltage boosted word-line signal. The driver control logic receives timing signals and row address information to provide timing control signals for the level shifting driver. The level shifting driver provides a voltage boosted word-line signal for a predetermined period of time in response to the timing control signals. Furthermore, the driver control logic provides control to the level shifting driver circuit to assure that transistors that drive the word-line signal are not damaged by voltage during a switching transition.

10 Claims, 4 Drawing Sheets

DRAM WITH A CONTROLLED BOOSTED VOLTAGE LEVEL SHIFTING DRIVER

FIELD OF THE INVENTION

This invention relates to a memory circuit, and in particular to a DRAM driver circuit.

BACKGROUND OF THE INVENTION

A DRAM memory cell of a DRAM circuit typically has a pass transistor connected to a storage capacitor. The DRAM memory cell must dynamically retain a voltage level or charge level within the storage capacitor for a significant period of time in order to sustain a predetermined logic state. There are various combinations of semiconductor manufacturing process methods of assuring that this voltage or charge is retained. A first process method utilizes a processing technique where the capacitance of the storage capacitor of the DRAM memory cell and charge leakage at the junction between the pass transistor and storage capacitor are adequate to sustain a valid logic state for a predetermined period of time. Additionally, a second process method is to provide a threshold voltage for the pass transistor of the DRAM memory cell that is sufficiently high to avoid a charge leakage condition from the storage capacitor of the DRAM memory cell to a common bit line.

A circuit design technique for assuring that the DRAM memory cell maintains a predetermined logic state is to store as much charge on the storage capacitor of the DRAM memory cell as possible. The implementation of this circuit design technique requires that the bit line of the DRAM memory cell be connected to a bit line driver whose output is at a power supply voltage $V_{DD}$, and requires a word-line control signal, connected to a control terminal of the pass transistor, be driven to a voltage equal to or above the power supply voltage $V_{DD}$ plus the threshold voltage of the pass transistor. This technique allows the full $V_{DD}$ voltage present on the bit line to be connected to the storage capacitor of the DRAM memory cell. Furthermore, the above process and design techniques are commonly utilized in combination in a known DRAM circuit.

There are various circuit techniques which are utilized to generate a word-line voltage that is higher than the normal power supply voltage $V_{DD}$. One such circuit technique is to use a charge coupling technique called "bootstrapping" along with a boosted voltage level. Bootstrapping allows the word-line control signal to be boosted above the normal power supply voltage by trapping charge on a gate terminal of a booting transistor when its drain terminal is at a low voltage level, and then to transition the drain terminal voltage of the booting transistor to a boosted voltage level. This action results in capacitively coupling the voltage on the gate terminal of the booting transistor to a voltage which is equal to the change in voltage of the drain terminal of the booting transistor plus the voltage trapped on the gate terminal of the booting transistor. Having the gate terminal of the booting transistor at an elevated voltage permits the boost voltage, connected to the drain terminal of the booting transistor, to be fully transferred to a source terminal of the booting transistor without the normal threshold voltage drop across the booting transistor. However, a primary problem with operating an MOS transistor having small physical dimensions using a boosted voltage is that the boosted voltage may destroy the thin gate oxide or a diffused junction, such as a source or drain junction, during a transistor switching operation. For this reason bootstrapping may not be desirable in an advanced MOS semiconductor manufacturing process.

Another circuit technique is to provide a boosted voltage, which is higher than the standard operating voltage of the DRAM, to a CMOS inverter circuit that drives a word-line signal. A disadvantage to this design approach is that the CMOS transistors that drive the word-line signal must be capable of withstanding the higher operating voltage level during a switching operation, and this is not always possible with an advanced semiconductor manufacturing process.

SUMMARY OF THE INVENTION

The previously mentioned needs are fulfilled with the present invention. In one form, a DRAM is provided having an array of memory cells located at intersections of bit lines and word-lines. Each memory cell has a transistor and a capacitor wherein the transistor has a control electrode connected to a predetermined word-line. A controlled level shifting driver circuit is provided for driving a predetermined one of the word-lines. A level shifting driver has at least one output driver transistor and a first control input for activating the word-line in response to receiving a first control signal. The level shifting driver activates the word-line to a first predetermined voltage coupled to a variable power supply terminal. The first predetermined voltage has a predetermined value which initially limits an amount of voltage between two current electrodes of the driver transistor to a predetermined maximum amount while the word-line is being activated. The level shifting driver has a reset terminal for deactivating the word-line in response to receiving a second control signal at a second control input. A control portion is coupled to the level shifting driver for selectively providing the second control signal to deactivate the word-line, and selectively providing a second predetermined voltage which is a predetermined amount greater than the first predetermined voltage. No voltage is generated within the control portion which is greater in potential than the second predetermined voltage. The second predetermined voltage is coupled to the word-line a predetermined amount of time after the word-line is activated to the first predetermined voltage. These and other features, and advantages, will be more clearly understood from the following detailed description taken in conjunction with the accompanying drawings.

DESCRIPTION OF A PREFERRED EMBODIMENT

For the purpose of efficiently reading and writing a row of DRAM bit cells within a DRAM bit array, the voltage of the word-line signal must be boosted. Further, it is desired that the boosted voltage of the word-line signal be equal to the sum of the power supply voltage plus a voltage threshold of the pass transistor of the DRAM bit cell. However, a primary problem with operating an MOS transistor having small physical dimensions using a boosted voltage is that the boosted voltage may destroy the thin gate oxide or a diffused junction, such as a source or drain junction, during a transistor switching operation. After the switching operation is complete, however, the positive power supply terminal of the switched MOS transistor can be elevated to a power supply voltage that is boosted. The boosted voltage is either provided for by a power supply source external to the DRAM or generated internal to the DRAM circuit by a charge pump circuit. The present invention provides a controlled level shifting driver circuit with control logic that generates a word-line signal with the above-mentioned desired switching and voltage characteristics.

Figure 1:
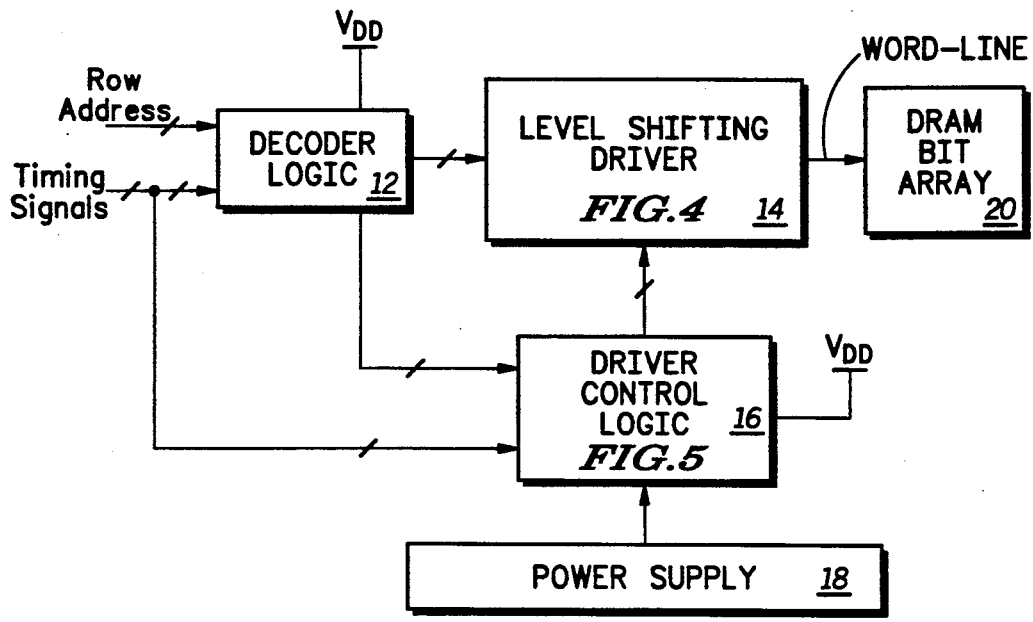
FIG. 1 illustrates in block diagram form a DRAM having a controlled level shifting driver circuit utilizing a boosted supply voltage in accordance with the present invention.

Illustrated in FIG. 1 is a DRAM control and driver circuit having a decoder logic 12, a level shifting driver 14, a driver control logic 16, a power supply 18, and a DRAM bit array 20. The decoder logic 12 has an address input to receive addresses via a signal labeled "Row Address", an input to receive timing control signals labeled "Timing Signals", and a power supply input to receive a positive power supply voltage labeled "$V_{DD}$". The decoder logic 12 has a first data output connected to a first input of the level shifting driver 14, and a second data output connected to a first input of the driver control logic 16. The level shifting driver 14 has a control input connected to an output of the driver control logic 16, and a control output signal connected to an input of the DRAM bit array 20 labeled "Word-Line". In one form, the level shifting driver 14 has a P-channel switch (not shown) that drives the word-line signal up, and an N-channel switch (not shown) that drives the Word-Line signal down, where a switch is implemented by an MOS transistor. The control for the P and N-channel transistors that drive the Word-Line signal will be discussed in detail later. The driver control logic 16 has a control input to receive the timing control signals labeled "Timing Signals", a voltage terminal connected to positive power supply voltage $V_{DD}$, and a boosted power supply voltage input connected to an output of the power supply 18.

In operation, the decoder logic 12 provides decoded row addresses to both driver control logic 16 and level shifting driver 14 in response to the row address and timing signal inputs. The driver control logic 16 provides control signals and driver row addresses to the level shifting driver 14 in response to the decoded row addresses from decoder logic 12 and the timing signals. The power supply 18 provides a boosted power supply voltage to driver control logic 16. A predetermined portion of the control logic, within driver control logic 16 and illustrated later, is connected to power supply 18. At predetermined time periods, a predetermined number of outputs from the driver control logic 16 provides control signals and driver row addresses to the level shifting driver 14. The outputs from driver control logic 16 have an output voltage equal to the boosted power supply voltage received from the power supply 18. Level shifting driver 14, in part, functions to hold a word-line in a deactivated state when no row address data is present. The level shifting driver 14 also provides a Word-Line signal to the DRAM bit array 20 in response to both the decoded row address from decoder 12, as well as the control signals and the driver row addresses from the driver control logic 16. The DRAM bit array 20 contains a plurality of DRAM bit cells (not illustrated). A predetermined row of DRAM bit cells (not illustrated) has a control terminal of a pass transistor (not illustrated) of each cell connected to a predetermined common word-line signal.

Figure 2A:
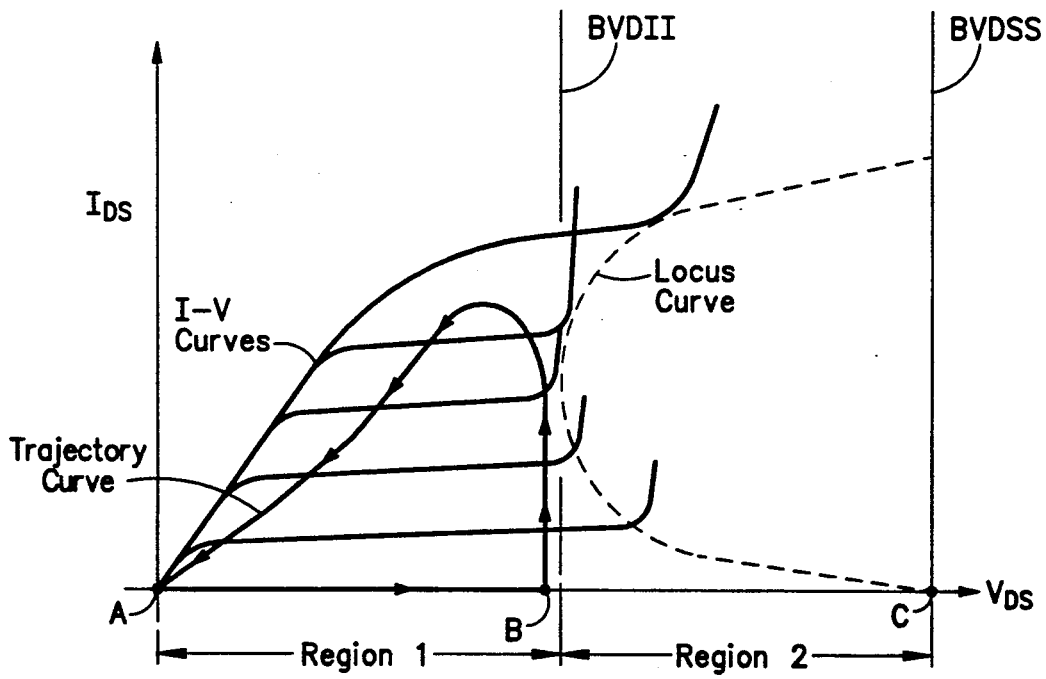
FIG. 2A illustrates in graphical form current and voltage operating characteristics of an N-channel MOS transistor in accordance with the present invention.

An insight to the operation of the present invention may be gained by referring to FIG. 2A which is a graph that illustrates a current-voltage (I-V) switching characteristic of an N-channel MOS transistor. The graph has a horizontal axis labeled $V_{DS}$, and a vertical axis labeled $I_{DS}$. The $V_{DS}$ represents the drain-to-source voltage of the transistor, and the $I_{DS}$ represents the drain-to-source current of the transistor. The graph illustrates a family of I-V curves, labeled "I-V curves", that have a predetermined abrupt-high-current operating point. The abrupt-high-current point of each of the curves is demonstrated by an abrupt increase in the $I_{DS}$ current. Collectively, the abrupt-high-current points of each curve form another curve labeled a "locus curve". The minimum $V_{DS}$ voltage point of the locus curve is the maximum $V_{DS}$ voltage at which the MOS transistor can safely switch current without possibly being damaged. This maximum $V_{DS}$ voltage is represented by a vertical line labeled "BVDII38." Another maximum $V_{DS}$ operating voltage associated with the MOS transistor is represented by a vertical line labeled "BVDSS." The BVDSS voltage is the maximum voltage that can be applied across the MOS transistor with a minimum $I_{DS}$ current before the MOS transistor is damaged.

The I-V curve is divided into a first operating region and a second operating region respectively labeled "Region 1" and "Region 2." Region 1 corresponds to a safe operating range of an N-channel MOS transistor during a switching operation. Region 2 corresponds to an extended $V_{DS}$ voltage range that can be applied to the MOS transistor after the MOS transistor is switched. A transistor operating in Region 1 has a first stable operating point labeled "A", and a second stable operating point labeled "B". The first stable operating point A corresponds to a low $V_{DS}$ voltage and a low $I_{DS}$ current. The second stable operating point B corresponds to a high $V_{DS}$ voltage and a low $I_{DS}$ current. When the MOS transistor transitions from a conductive state to a non-conductive state, and from the non-conductive state to the conductive state, the current and voltage of the MOS transistor follow a curve labeled "Trajectory Curve", as illustrated in FIG. 2A. Region 2 has a stable operating point labeled "C" which corresponds to the maximum $V_{DS}$ voltage operating condition discussed above. The trajectory path for the transistor that transitions from the stable operating point B to the stable operating point C is along the horizontal axis. The $I_{DS}$ current of the transistor is minimum during the time that the $V_{DS}$ voltage is increased to the operating point C and back to the operating point B.

Figure 2B:
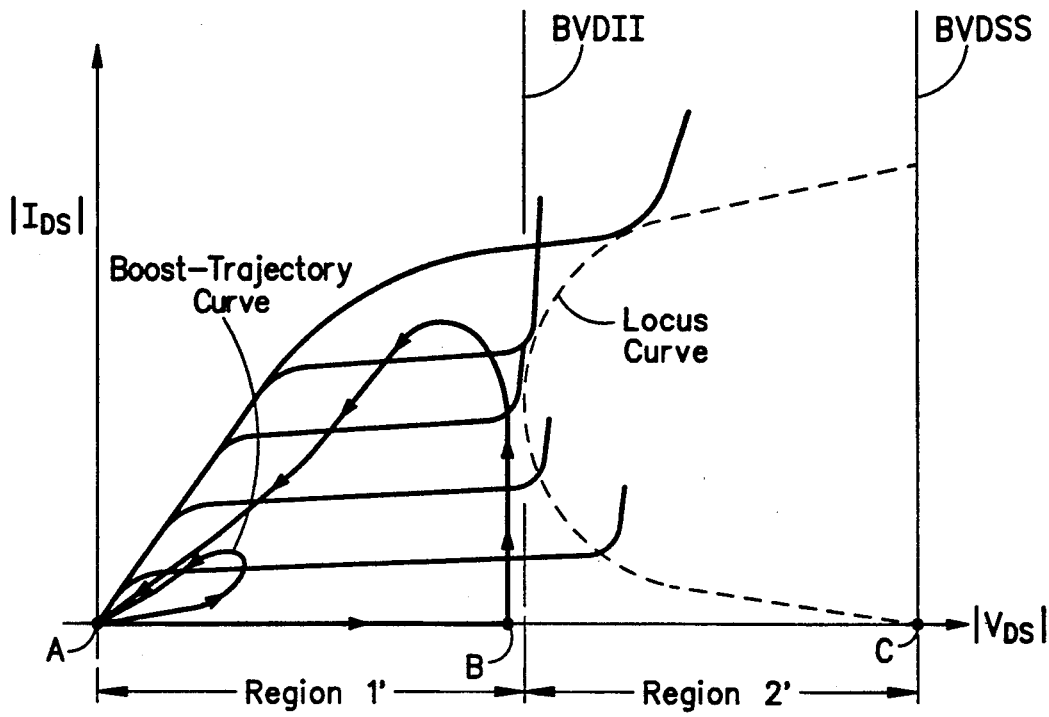
FIG. 2B illustrates in graphical form current and voltage operating characteristics of a P-channel MOS transistor in accordance with the present invention.

Illustrated in FIG. 2B is a graph that details a current-voltage (I-V) switching characteristic of a P-channel MOS transistor. The graph is similar to that of FIG. 2A with the following exceptions. The voltages and currents represented in FIG. 2B are illustrated as absolute value numbers, and there is an additional curve within Region 1' labeled "Boost-Trajectory Curve." The significance of the boost-trajectory curve will be discussed below.

Figure 3:
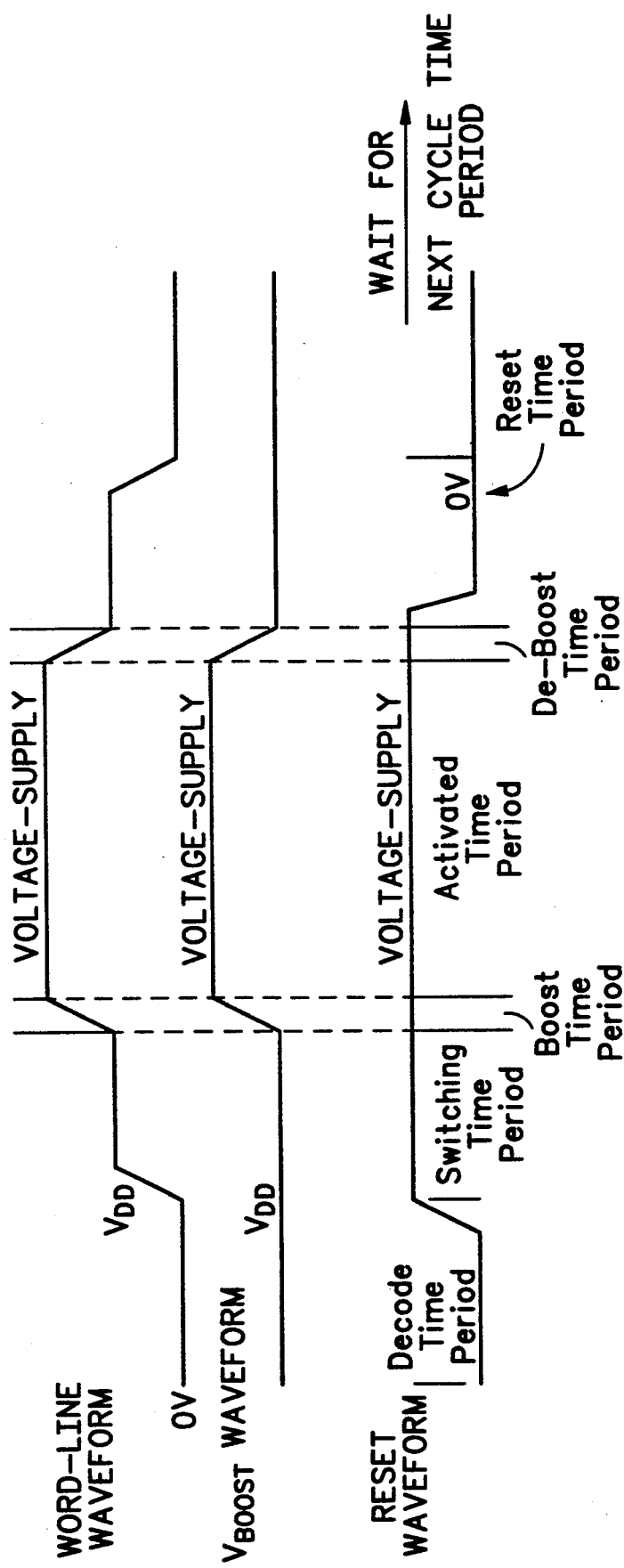
FIG. 3 illustrates in graphical form a timing diagram of control signals for use with the present invention.

Illustrated in FIG. 3 is a timing diagram having a first voltage waveform labeled "Word-Line Waveform", a second voltage waveform labeled "$V_{Boost}$ Waveform", and a third voltage waveform labeled "Reset Waveform". The Word-Line Waveform represents the Word-Line signal output of the level shifting driver 14. The $V_{Boost}$ Waveform represents one of the control signals of driver control logic 16 which is a variable power supply control signal output of driver control logic 16. The Reset Waveform is another control signal provided by driver control logic 16 and provides a reset function. In the illustrated form, the Reset Waveform is an active low signal. The timing diagram of FIG. 3 is divided into a decode time period, a switching time period, a boost time period, an activated time period, a de-boost time period, a reset time period, and a wait for next cycle time period.

In operation, there are two operational conditions: a selected and an unselected operating condition. The following is a detailed discussion for the selected operating condition. During the decode time period illustrated in FIG. 3, the decoder logic 12 of FIG. 1 provides decoded row addresses for driver control logic 16 in response to the row address and timing signal input. The driver control logic 16 then provides a decoded row address and control signals to the level shifting driver 14. The Reset Waveform is activated which forces the output of level shifting driver 14 to a predetermined logic state which does not select a row of memory cells in DRAM bit array 20.

During the switching time period illustrated in FIG. 3, the driver control logic 16 of FIG. 1 deactivates the reset signal to the level shifting driver 14. The level shifting driver 14 generates the Word-Line signal output front a zero volt reference level to the voltage level $V_{DD}$ in response to the decoded row address and the control signals from the driver control logic 16. The trajectory curves within the I-V graphs of FIG. 2A and FIG. 2B demonstrate how transistors (not yet shown in detail) that are used to drive the Word-Line signal transition to each of the stable operating points A and B through the trajectory curve. For example, when the Word-Line output signal transitions from a voltage low level to a voltage high level, an N-channel transistor transitions from the stable operating point A to the stable operating point B along the horizontal axis trajectory path. In contrast, a P-channel transistor transitions from the stable operating point B to the stable operating point A along a high current trajectory path. When the Word-Line signal transitions from the voltage high level to the voltage low level, the N-channel transistor transitions along the high current trajectory path from the stable operating point B to the stable operating point A, and the P-channel transistor transitions along the horizontal axis trajectory path from the stable operating point A to the stable operating point B.

During the boost time period of FIG. 3, the voltage output from the driver control logic 16 of FIG. 1 is elevated from the voltage level $V_{DD}$ to the voltage level Voltage-Supply. The trajectory path for the P-channel transistor during the boost transition is along a curve labeled "boost-trajectory-curve" as illustrated in the FIG. 2B. This trajectory curve represents the $I_{DS}$ current and $V_{DS}$ voltage of the P-channel transistor that drives the Word-Line signal from voltage level $V_{DD}$ to the voltage level Voltage-Supply. The trajectory path for the N-channel transistor during the boost time period is along the horizontal axis from the stable operating point B to the stable operating point C. At the stable operating point C, the N-channel transistor is operating at the maximum safe $V_{DS}$ voltage, BVDSS, without damaging the transistor.

During the activated time period of FIG. 3, the Word-Line signal of FIG. 1 is maintained at the Voltage-Supply level for a predetermined amount of time in order to access a row of DRAM bit cells (not illustrated) within the DRAM bit array 20.

During the de-boost time period of FIG. 3, the Word-Line voltage signal is reduced from the Voltage-Supply voltage to the $V_{DD}$ voltage in response to the voltage output from the driver control logic 16 being reduced from Voltage-Supply to $V_{DD}$. During the de-boost time period, the N-channel transistor transitions along the horizontal axis from the stable operating point C to the stable operating point B, and the P-channel transistor transistions approximately along the boost-trajectory-curve illustrated in FIG. 2B.

During the reset time period of FIG. 3, the Word-Line signal is switched from the $V_{DD}$ voltage to a voltage of zero in response to the Reset signal from the driver control logic 16. During the reset time period, the N-channel transistor transitions along the high current trajectory path from stable operating point B of FIG. 2A to stable operating point A, and the P-channel transistor transitions along the horizontal axis from the stable operating point A of FIG. 2B to the stable operating point B. During the wait for next cycle time period, the active low Reset signal from driver control logic 16 remains in the inactive state until another DRAM row address cycle begins. During the 'wait for next cycle' time period, the N-and P-channel transistors remain in the previous stable operating state.

The following is a discussion of the unselected operating condition. The row address and timing sequence is similar to the selected operating condition except that the row address signals do not detect a valid decode that activates a Word-Line signal from the output of the level shifting driver 14 of FIG. 1. Furthermore, since a Word-Line signal is not activated, the trajectory paths for the N- and P-channel transistors that drive the Word-Line signal are different. The Reset Waveforms for the selected and unselected operating conditions are identical.

During the decode time period of FIG. 3, the decoder logic 12 does not detect a valid decode. During the switching time period, the Word-Line signal remains at zero volts. The P-channel transistor that drives the Word-Line signal remains at the stable operating point B. The N-channel transistor that drives the Word-Line signal remains at the stable operating point A. During the boost time period, the Word-Line signal remains at zero volts, the P-channel transistor transitions along the horizontal axis from stable operating point B to the stable operating point C, and the N-channel transistor remains at the stable operating point A. During the activated time period, the Word-Line signal remains at zero volts, the P-channel transistor remains at the stable operating point C, and the N-channel transistor remains at the stable operating point A. During the deboost time period, the P-channel transistor transitions along the horizontal axis from the stable operating point C to the stable operating point B, and the N-channel transistor remains at the stable operating point A. During the reset time period, the previous operating conditions for the N- and P-channel transistors remain the same.

A primary difference between the operation of the N- and P-channel transistors that drive the Word-Line signal for the selected and unselected operating condition is the $V_{DS}$ voltage across the N- and P-channel transistors during the activated time period of FIG. 3. For the selected operating condition, the $V_{DS}$ of the N-channel transistor is at or near the BVDSS voltage and the $V_{DS}$ voltage of the P-channel transistor is near zero volts. In contrast, for the unselected operating condition, the $V_{DS}$ of the N-channel transistor remains near zero volts, and the $V_{DS}$ of the P-channel transistor is at or near the BVDSS voltage. For the N- and P-channel transistors to operate at or near the BVDSS voltage, it is necessary that the control logic, such as driver control logic 16 of FIG. 1, that provides the boosted voltage to the level shifting driver 14 allows the N- and P-channel transistors to only switch when the supply voltage for the Word-Line transistors is less than BVDII. Another primary function of the driver control logic 16, which operates in a DRAM, is to provide the necessary control, such as the $V_{DD}$ to Voltage-Supply transitions, as quickly as possible for the fastest possible DRAM access time.

In summary, the Word-Line signal from the level shifting driver 14 is switched from a voltage of zero to a voltage of $V_{DD}$ and back to a voltage of zero only when the power supply voltage for the level shifting driver is below the BVDII voltage. The BVDII voltage is typically slightly higher than the power supply voltage $V_{DD}$. After the Word-Line signal has switched to the $V_{DD}$ voltage, the control logic 16 elevates the power supply voltage connected to the level shifting driver to the Voltage-Supply voltage. The $V_{DD}$ to Voltage-Supply voltage transition occurs along the boost-trajectory curve illustrated in FIG. 2B. The $V_{Boost}$ waveform voltage is lowered to the $V_{DD}$ voltage after a predetermined period of time in response to the driver control logic 16. The Word-Line signal is then switched from the $V_{DD}$ voltage to the zero voltage level and remains at the zero voltage level until another DRAM access occurs. For both the unselected and selected operating conditions, the driver control logic 16 provides the boosted supply voltage to the N- and P-channel transistors that drive the Word-Line signal in a manner that will not damage the transistors and yet still allow for a fast DRAM access time.

Figure 4:
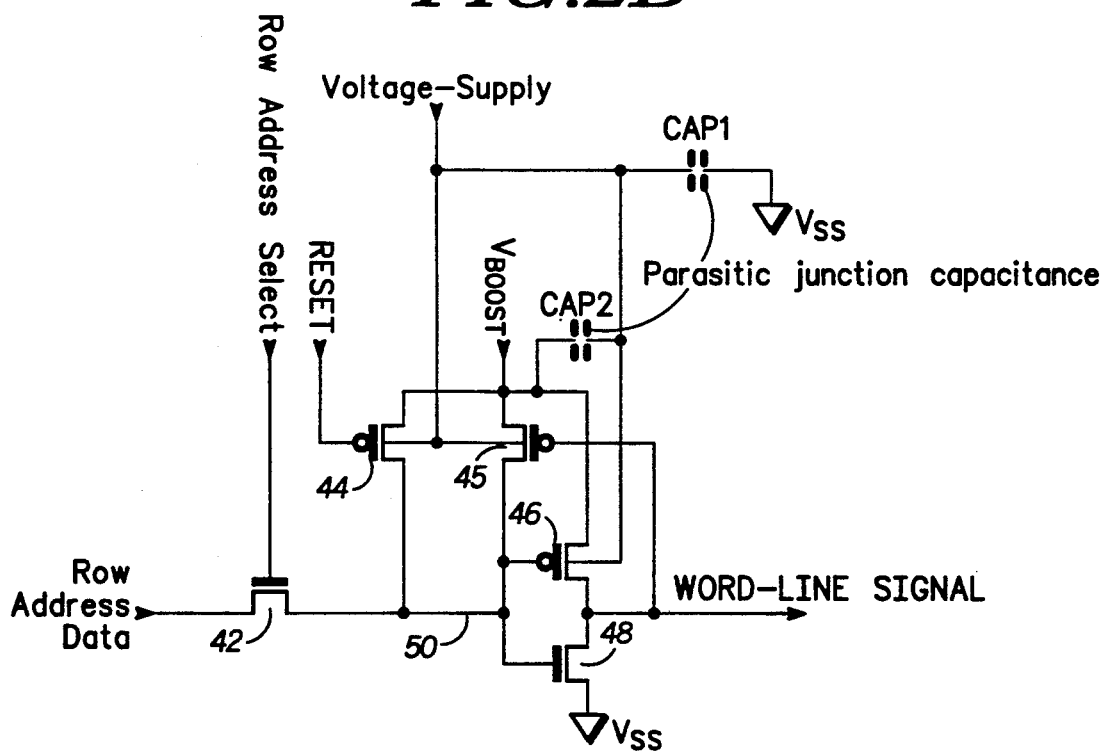
FIG. 4 illustrates in schematic diagram form a level shifting driver circuit illustrated in FIG. 1.

FIG. 4 illustrates in schematic form the level shifting driver circuit 14 of FIG. 1. The level shifting driver circuit 14 provides the Word-Line waveform output illustrated in FIG. 3. The level shifting driver circuit 14 comprises transistor switches 42, 44, 45, 46 and 48, a first parasitic capacitor labeled "CAP1", and a second parasitic capacitor labeled "CAP2". Switches 44, 45 and 46 are each conductive when a control terminal of each switch is at a low logic level. Switches 42 and 48 are each conductive when a control terminal of each switch is at a high logic level.

Switch 42 has a first electrode connected to an input signal labeled "Row Address Data", a control electrode connected to a control signal labeled "Row Address Select", and a second electrode connected to a node 50. Switch 44 has a first electrode connected to a power supply signal labeled $V_{Boost}$, a control terminal connected to a control signal labeled "Reset", and a second electrode connected to node 50. Switch 45 has a first electrode connected to the power supply signal labeled "$V_{Boost}$", a control terminal connected to the output signal waveform labeled "Word-Line Signal", and a second electrode connected to node 50. Switch 46 has a first electrode connected to the power supply signal labeled "$V_{Boost}$", a control electrode connected to node 50, and a second electrode connected to the Word-Line Signal. Switch 48 has a first electrode connected to power supply $V_{SS}$ which is typically zero volts. A control electrode of switch 48 is connected to the node 50, and a second electrode of switch 48 is connected to the Word-Line signal. Switches 44-46 share a common process well diffusion, and are connected to a power supply terminal for continuously receiving the "Voltage-Supply" voltage of FIG. 3. The output of power supply 18 provides the Voltage-Supply voltage. Parasitic capacitance CAP1 may be represented as having a first electrode connected to the Voltage-Supply terminal, and a second electrode connected to a $V_{DD}$ terminal. Parasitic capacitance CAP2 may be represented as having a first electrode connected to the power supply $V_{Boost}$, and a second electrode connected to the voltage-supply terminal.

In operation, a DRAM containing a plurality of DRAM bit cells will also contain a plurality of word-line driver circuits, such as level shifting driver 14. Each level shifting driver 14 has parasitic capacitances such as CAP1 and CAP2. The inherent parasitic capacitances CAP1 and CAP2 function to maintain stable supply voltages. Switches 46 and 48 form a CMOS inverter with an input at node 50 and an output labeled "Word-Line Signal". Switch 44 connects the power supply $V_{Boost}$ to node 50 in response to the Reset signal. As illustrated in FIG. 3, the Reset signal is active (logic level low) at both the beginning and the end of each row address cycle. The Word-Line signal transitions to the inactive state whenever the Reset signal is active. Switch 42 connects the row address data to node 50 in response to an active row address select signal after the Reset signal goes inactive. If the logic state of the row address data is high (inactive state) when the row address select signal is activated, the preset voltage level is maintained on node 50, and the Word-Line signal remains in the inactive state by switch 45. If the row address data is low (active state) when the row address select signal is active, node 50 will transition low. When node 50 transitions low, the CMOS inverter formed by switches 46 and 48 transitions the Word-Line signal from the inactive state (zero volts output) to an active output state. The above voltage transitions are illustrated in FIG. 3 during the switching time period when level shifting driver 14 activates the word-line to a first predetermined voltage, $V_{DD}$, for a first time period (the switching time period). The voltage of the active output state during the switching time period, which is the voltage residing at the voltage-supply terminal, is $V_{DD}$ having a predetermined value no greater than a predetermined maximum value which initially limits an amount of voltage between two current electrodes of the output driver transistor (switch 46 or switch 48) to a predetermined maximum amount while the word-line is activated. After a predetermined period of time, the $V_{Boost}$ waveform is elevated to a higher voltage level, labeled "VOLTAGE SUPPLY" and maintained at this voltage level for a predetermined period of time. This time period is illustrated in FIG. 3 as the "activated time period." The sequence of remaining events that reset the Word-Line signal are previously discussed and are illustrated in FIG. 3.

Figure 5:
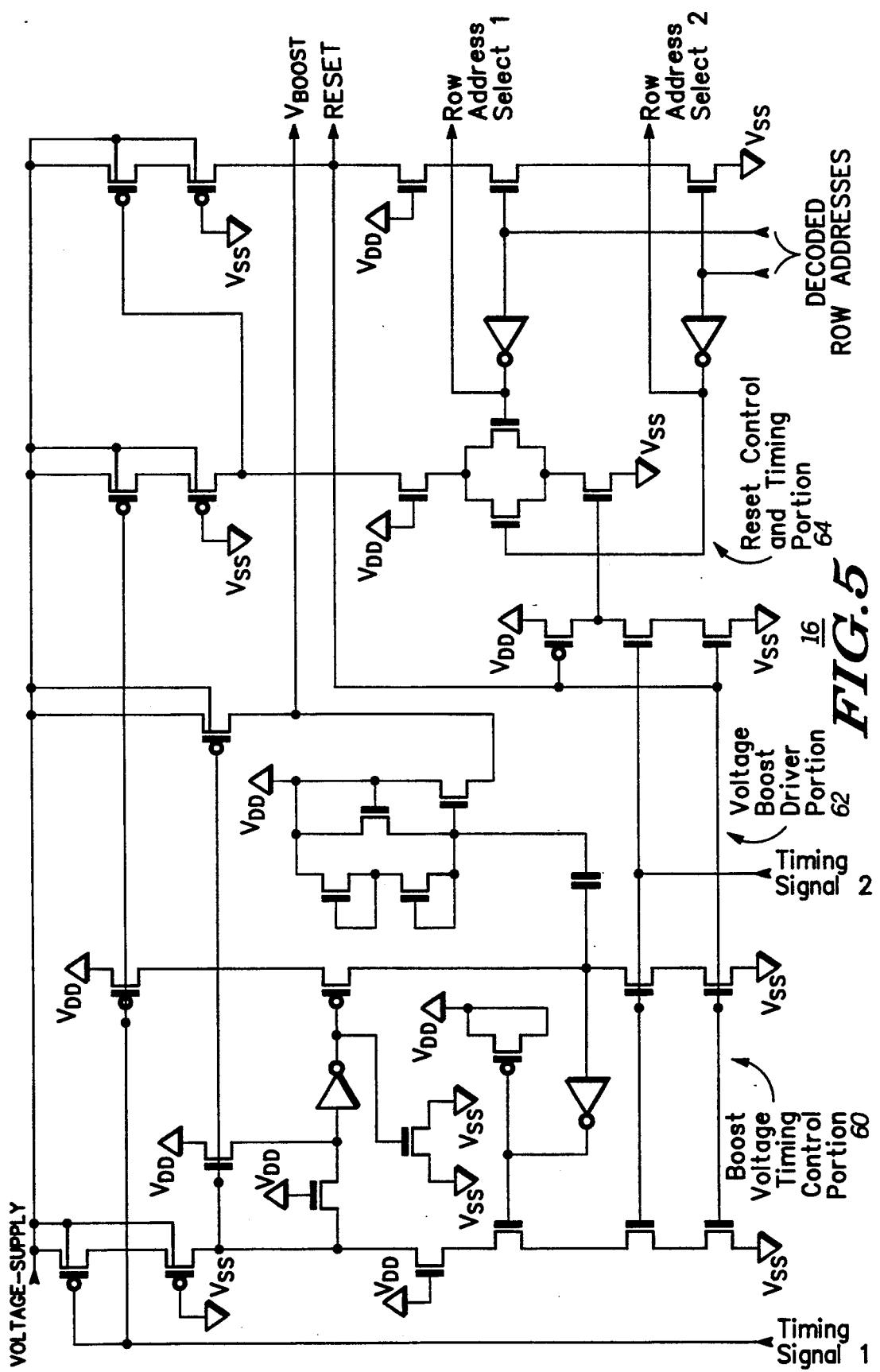
FIG. 5 illustrates in partial schematic diagram form a driver control logic circuit illustrated in FIG. 1.

FIG. 5 illustrates an implementation of driver control logic circuit 16 of FIG. 1. The driver control logic circuit 16 has a boost voltage timing control portion 60, a voltage boost driver portion 62, and a reset control and timing portion 64.

In operation, the boost voltage timing control portion 60 receives the timing control signals illustrated in FIG. 1, and provides $V_{Boost}$ timing control signals (not labeled) for the voltage boost driver portion 62. The boost driver portion 62 of FIG. 5 provides the voltage labeled "$V_{Boost}$", in response to the $V_{Boost}$ timing control signals. The $V_{Boost}$ timing waveform is illustrated in FIG. 3. The reset control and timing portion 64 controls a signal labeled "Reset", and provides buffering for the decoded row addresses. The timing of the Reset signal is also illustrated in FIG. 3.

An advantage of the driver control logic circuit 16 is that all the voltages created within the control logic circuit 16 are limited to no greater than approximately the voltage of the word-line signal of the level shifting driver circuit of FIG. 4. In contrast, the voltages within a conventional word-line driver control circuit for a DRAM utilizing bootstrapping circuit techniques are generally several transistor threshold voltages above the voltage of the word-line signal. Driver control logic 16 is able to limit internal voltages to no greater than approximately the voltage of the word-line signal through the use of both P- and N-channel transistors. By utilizing both P- and N-channel transistors, a problem associated with a threshold voltage drop across an MOS transistor when utilizing exclusively a P-channel or an N-channel transistor is eliminated. The importance of the advantage of limiting the voltages within driver control logic circuit 16 to approximately the voltage of the word-line signal is to prevent damaging MOS transistors having small physical dimensions.

A common problem with controlling voltages that are higher than a specified system power supply voltage is isolating transistor circuits that are powered by a normal power supply voltage, such as $V_{DD}$, from transistor circuits that connect to the higher than normal power supply voltage, such as the Voltage-Supply. The problem of isolating the transistor circuits with differing power supplies is solved in the driver control logic 16 by using MOS transistors (not specifically numbered in FIG. 5) having a gate connected to either $V_{DD}$ or $V_{SS}$ to provide the necessary isolation. The MOS transistors provide the necessary isolation via an inherent $V_{DS}$ voltage drop across the isolation transistor which functions as an additional $V_{DS}$ voltage drop to reduce or isolate a higher voltage region of the circuit from a lower voltage region of the circuit.

In more detail, "Timing Signal 1" of the boost voltage timing control portion 60 of FIG. 5 transitions from an active state to an inactive state signifying the beginning of a DRAM row address cycle. Also, a predetermined one of "Decoded Row Address" signals coupled to the reset control and timing portion 64 transitions from an inactive state to an active state. After the time when the predetermined Decoded Row Address signal transitions to the active state, the "Reset" signal from the reset and control and timing portion 64 transitions from an active state to an inactive state, and a corresponding word-line signal from a predetermined level shifting driver circuit, such as level shifting driver circuit 14 of FIG. 4, transitions from a zero voltage level to a first voltage supply level $V_{DD}$. After a predetermined amount of time, "Timing Signal 2" of boost voltage timing control portion 60, transitions from an inactive state to an active state. After Timing Signal 2 transitions to the active state, "$V_{Boost}$" transitions from the first voltage level $V_{DD}$ to a second voltage level, "Voltage-Supply". The Voltage-Supply, provided by power supply 18 of FIG. 1, is a predetermined amount of voltage greater than the first voltage supply level $V_{DD}$. The $V_{Boost}$ signal is driven by the voltage boost driver portion 62 of FIG. 5 and is controlled, in part, by the boost voltage timing control portion 60. The $V_{Boost}$ voltage waveform is further illustrated in the voltage timing diagram of FIG. 3. In response to the transition of the $V_{Boost}$ voltage transition from the first voltage level $V_{DD}$ to the second voltage level Voltage-Supply, the word-line signal of the predetermined level shifting driver circuit transitions from the first voltage level $V_{DD}$ to the second voltage level Voltage-Supply. After a predetermined amount of time, "Timing Signal 2" of boost voltage timing control portion 60 transitions from the active state to the inactive state. After a predetermined amount of time, which is controlled by external logic (not illustrated), Timing Signal 1 becomes active and the voltage boost driver portion 62 reduces the $V_{Boost}$ voltage from the second voltage level, Voltage-Supply, to the first voltage level $V_{DD}$. In response to the transition of the Timing Signal 1 to the active state, the circuits within both the boost voltage timing control portion 60 and the voltage boost driver portion 62 are initialized to a predetermined quiescent state. Also in response to the transition of $V_{Boost}$ to the voltage level $V_{DD}$, the word-line signal of the predetermined level shifting driver circuit transitions from the second voltage level, Voltage-Supply, to the first voltage level, $V_{DD}$. A predetermined amount of time after $V_{Boost}$ transitions to the first voltage level $V_{DD}$, the predetermined activated Decoded Row Address signal transitions from the active state to the inactive state. In response to the transition of the Decoded Row Address signal to the inactive state, the Reset signal from reset control and timing portion 64 transitions from the inactive state to the active state. When the Reset signal transitions to the active state, the word-line signal of the predetermined level shifting driver circuit transitions from the first voltage level, $V_{DD}$, to the zero voltage level. Again, these voltage waveforms are illustrated in the voltage timing diagram of FIG. 3.

Another advantage of driver control logic 16 is that a continuous electrical path between any two of the three power supplies, Voltage-Supply, $V_{DD}$, and $V_{SS}$, never occurs during operation. This advantage is important for reducing power consumption of a DRAM. This advantage is even more significant when considering that, in a preferred form, the Voltage-Supply is generated by a charge pump circuit (not shown) within power supply 18. Since the charge pump circuit is contained on the same monolithic piece of silicon as the DRAM, the reduction in the charge pump's power consumption is very important. The control to guarantee that there is never a connection between any two of the three power supplies is provided by the illustrated circuitry within the boost voltage timing control portion 60 in combination with the timing of the externally provided signals.

In summary, the driver control logic 16 receives both timing control signals and row addresses to provide both control signals and decoded row addresses for the level shifting driver 14. The driver control logic 16 provides the timing control signals for the level shifting driver circuit 14 to increase the voltage of the word-line signal in a manner that will not damage the MOS transistors within the level shifting driver circuit 14 illustrated in FIG. 4 and driver control logic 16 illustrated in FIG. 5. Because the word-line signal voltage waveform is controlled in the manner described herein by driver control logic 16 of FIG. 5, driver control logic 16 may be implemented in an advanced MOS processing technology having transistors with small physical dimensions. The trajectory curves of FIG. 2A and FIG. 2B illustrate how the transistors that drive the Word-Line signal transition in response to the driver control logic 16 of FIG. 5. The driver control logic 16 provides timing control signals for the level shifting driver 14 to first reduce the voltage of the Word-Line signal from the Voltage Supply to the voltage $V_{DD}$ for a predetermined period of time, and then from $V_{DD}$ to a voltage of zero. By controlling the timing and voltage of the level shifting driver circuit, the Word-Line signal within the DRAM is able to access the DRAM bit cells in a timely manner without damaging the MOS transistors.

There is thus provided a DRAM level shifting driver having a combination of advantageous characteristics. A driver control circuit provides a boosted voltage to a Word-Line driver circuit. The Word-Line driver circuit switches the Word-Line signal to a first voltage level and then to a second higher voltage level in response to the driver control circuit. The first voltage level is at a safe level for switching the transistors, and the second voltage level is a predetermined voltage higher than the first voltage which is advantageous for accessing a row of DRAM bit cells. This timing and voltage control is advantageous for a DRAM.

While there have been described herein the principles of the invention, it is to be clearly understood to those skilled in the art that this description is made only by way of example and not as a limitation to the scope of the invention. For example; although a particular control circuit for controlling a boosted voltage is illustrated, various other logical and circuit implementations that perform the desired voltage controlling function may be utilized. Accordingly, it is intended, by the appended claims, to cover all modifications of the invention which fall within the true spirit and scope of the invention.

I claim:

1. In a DRAM having an array of memory cells located at intersections of bit lines and word-lines, each memory cell having a transistor and a capacitor wherein the transistor has a control electrode connected to a predetermined word-line, a controlled level shifting driver circuit for driving a predetermined one of the work-lines, comprising:

level shifting driver means having at least one output driver transistor and having a first control input for placing the word-line in an active state in response to receiving a first control signal, the level shifting driver means driving the word-line to a first predetermined voltage for a first predetermined amount of time, the first predetermined voltage having a predetermined value which initially limits an amount of voltage between two current electrodes of the output driver transistor to a predetermined maximum amount while the word-line is placed in the active state, the level shifting driver means having a reset terminal for placing the word-line in an inactive state in response to receiving a reset signal at a second control input; and control means coupled to the level shifting driver means for selectively providing the reset signal to place the word-line in the inactive state, and selectively providing a second predetermined voltage which is a predetermined amount greater than the first predetermined voltage, the second predetermined voltage being coupled to the word-line a second predetermined amount of time after the first predetermined amount of time.

2. The level shifting driver circuit of the DRAM of claim 1 wherein the level shifting driver means further comprise a control transistor having a control electrode connected to the second control input for receiving the reset signal, the control transistor changing a bias voltage of the at least one output driver transistor in response to the reset signal to place the word-line in the inactive state.

3. The level shifting driver circuit of the DRAM of claim 1 further comprising:

address decoding means coupled to the level shifting driver means for receiving an input address and providing the first control signal in response thereto.

4. The level shifting driver circuit of the DRAM of claim 1 wherein the control means further controls the word-line by returning the word-line to the first predetermined voltage a third predetermined amount of time following the second predetermined amount of time and before placing the word-line in the inactive state.

5. The level shifting driver circuit of the DRAM of claim 1 wherein the second predetermined voltage is generated by a charge pump power supply contained on a same monolithic piece of semiconductor material as the DRAM.

6. In a DRAM having an array of memory cells located at intersections of bit lines and word-lines, each memory cell having a transistor and a capacitor wherein the transistor has a control electrode connected to a predetermined word-line, a method for driving a predetermined one of the word-lines with a circuit having at least one driver transistor, comprising the steps of:

receiving a control signal to place the predetermined word-line in an active state, the word-line being driven from a first voltage to a second voltage for a first predetermined amount of time which is sufficiently long to ensure that the word-line is charged to the second voltage;

selecting a value of the second voltage to be no greater than a predetermined maximum value in order to prevent voltage between two current electrodes of the at least one driver transistor from exceeding the predetermined maximum value;

selectively providing a third voltage which is a predetermined amount greater than the second voltage;

coupling the third voltage to the word-line for a second predetermined amount of time after the first predetermined amount of time; and selectively placing the word-line in an inactive state in response to receiving a reset signal by forcing the word-line to substantially the second voltage for a third predetermined amount of time before forcing the word-line to the first voltage.

7. The method of claim 6 wherein the step of receiving a control signal further comprises decoding an input address and providing the control signal in response to said decoding.

8. The method of claim 6 wherein the step of providing a third voltage further comprises generating the third voltage with a charge pump power supply integrated into a same monolithic piece of semiconductor as the DRAM.

9. A controlled level shifting DRAM driver circuit for driving a predetermined one of a plurality of word-lines in a DRAM having an array of memory cells located at intersections of bit lines and the word-lines, each memory cell having a transistor and a capacitor wherein the transistor has a control electrode connected to a predetermined word-line, comprising:

level shifting driver means having a control input for receiving a control signal to place the word-line in an active state, the word-line being placed in the active state by being electrically driven to a first predetermined voltage for a first time period; and control means coupled to the level shifting driver means for selectively providing a second predetermined voltage which is a predetermined amount greater than the first predetermined voltage, the second predetermined voltage being coupled to the word-line during a second time period immediately after the word-line is placed in the active state by being electrically driven to the first predetermined voltage during the first time period, the word-line being placed in an inactive state by initially returning the word-line to the first predetermined voltage for a predetermined amount of time before the word-line is discharged to a third voltage.

10. The controlled level shifting DRAM driver circuit of claim 9 further comprising:

address decoding means coupled to the level shifting driver means for receiving an input address and providing the control signal in response thereto.

* * * * *